United States Patent [19]

Procter

[11] 4,059,812

[45] Nov. 22, 1977

[54] SYNCHRONOUS PULSE GENERATOR INCLUDING FLYWHEEL TANK CIRCUIT WITH PHASE LOCKED LOOP

[75] Inventor: Samuel Anderson Procter, Minneapolis, Minn.

[73] Assignee: Control Data Corporation, Minneapolis, Minn.

[21] Appl. No.: 743,891

[22] Filed: Nov. 22, 1976

[51] Int. Cl.² ............................................. H03B 3/04
[52] U.S. Cl. ................................. 331/1 A; 328/155; 331/17; 331/25; 331/36 C; 331/165
[58] Field of Search ............... 331/1 R, 1 A, 17, 18, 331/25, 36 C, 165; 328/155

[56] References Cited

U.S. PATENT DOCUMENTS

| | | | |
|---|---|---|---|
| 3,593,167 | 7/1971 | Koulopoulos | 331/36 CR |
| 3,609,408 | 9/1971 | Motisher et al. | 331/36 CR |
| 3,624,521 | 11/1971 | Dellicicchi | 328/155 X |
| 4,004,235 | 1/1977 | Roberts | 331/1 A X |

*Primary Examiner*—Siegfried H. Grimm
*Attorney, Agent, or Firm*—Edward L. Schwarz

[57] ABSTRACT

A circuit receiving a degraded synchronous pulse signal which has missing pulses and phase-shifted pulses, and producing an output signal similar to and at a constant phase angle with the input signal, in which the missing pulses have been replaced and the phase-shifted pulses shifted to the correct relative position. Provision is made for adjusting output signal frequency to long term drift in input signal frequency.

8 Claims, 4 Drawing Figures

SYNCHRONOUS PULSE GENERATOR INCLUDING FLYWHEEL TANK CIRCUIT WITH PHASE LOCKED LOOP

BACKGROUND OF THE INVENTION

1. Field of the Invention

The circuit is a type of phase-locked loop, i.e. a narrow-band filter which produces an output signal following the strongest signal frequency in the designed circuit signal bandwidth. They are widely used to produce the clock signal in the read-back date in magnetic disc and tape memories. This circuit can also perform as a frequency multiplier and divider by proper selection of components.

2. Description of the Prior Art

The closest art of which applicant is aware is U.S. Pat. No. 3,878,474 (Runge). Runge employs a voltage-controlled oscillator rather than the flywheel rank circuit of the instant invention. This difference creates a significant difference in capability and response. Other prior art akin to the invention comprises U.S. Pat. Nos. 3,204,195 (Maestre), 3,130,375 (Rotier et al.), 3,506,968 (Preti) and 3,908,174 (Hamada). This group of patents all disclose variations on the common RC oscillator aimed at preventing output phase shift.

BRIEF DESCRIPTION OF THE INVENTION

The degraded input signal, a signal which has occasional phase-shifted pulses and occasional totally omitted pulses, is received by a pulse detector which provides a square wave representation therefor. These pulses are applied to the pulse train input of a flywheel tank circuit whose resonant frequency changes under the control of a frequency control signal. Oscillations in the flywheel tank circuit will die out over a period of cycles unless in-phase pulses are received at its pulse train input. The tank's output, a sine wave of the resonant frequency specified by the frequency control signal, is supplied to a threshold detector, which may be a simple zero crossover detector, and whose output comprises the desired circuit output, a pulse signal with the phase shift and pulse omissions of the input corrected. A tank resonance control receives this corrected pulse signal output and the squared input signal and compares them, producing a frequency control signal for the tank which changes the tank's resonant frequency as needed to maintain a constant phase relationship between the input and output signals. The preferred pulse detector design accepts input pulses for only a short percentage of the time of each cycle, thereby restricting the bandwidth of the circuit. The pulse detector can also be designed to keep this percentage constant as input frequency changes.

Accordingly, one purpose of this invention is to provide a clock signal for decoding a synchronous data signal.

Another purpose is to perform frequency multiplication through use of the ability to insert pulses, and maintain oscillation with the presence of in-phase input pulses.

Another object is to provide a frequency divider by suitably restricting the "window" during which input pulses are permitted to produce an output pulse from the pulse detector.

Still another object is to provide a clock signal which remains in-phase with an input signal whose frequency slowly drifts with time.

DESCRIPTION OF THE PREFERRED EMBODIMENTS

Figure 1:
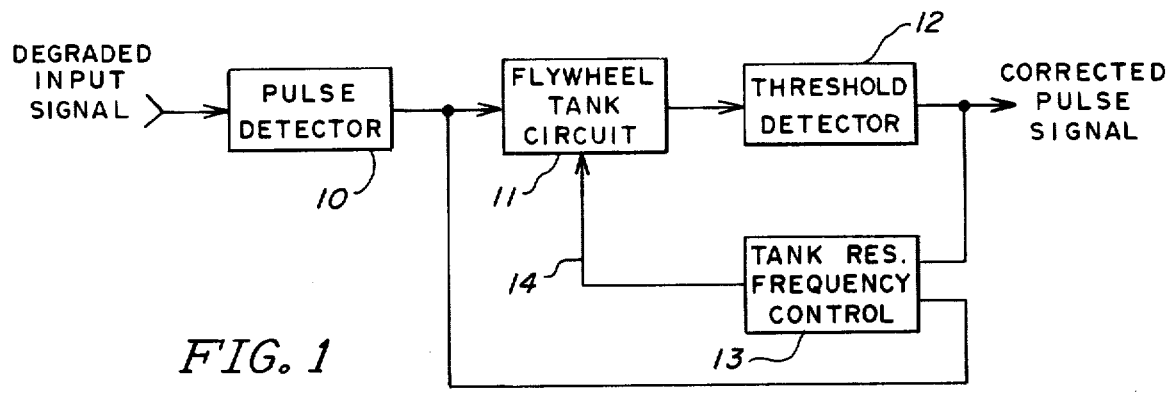
FIG. 1 is a block diagram of the invention.

The block diagram of FIG. 1 discloses the general mode of operation of this invention. Pulse detector 10 processes the degraded input signal by removing spurious pulses, squaring up the remaining pulses, and providing them in a signal with proper level to frequency control 13 and flywheel tank circuit 11. Flywheel tank circuit 11 produces a sine wave as long as it receives in-phase pulses from detector 10. Its resonant frequency varies responsive to a frequency control signal on signal path 14. Q of tank 11 is selected so that over a period of time when no input pulses are received, its output signal will decay below a pre-selected level, but which, as long as pulses in phase with tank 11 output are received from pulse detector 10, will maintain its output above the pre-selected level. The output of tank 11 is supplied to the input of threshold detector 12. Threshold detector 12 converts tank 11 sine wave output above the pre-selected level to a logic level square wave pulse train which comprises the corrected pulse signal desired. Threshold detector 12 can comprise a simple zero crossover circuit or other type of level detector. Frequency control 13 supplies the frequency control signal to tank 11. As the pulses from threshold detector 12 begin to lag those from pulse detector 10, frequency control 13 changes its output so as to slowly increase the resonant frequency of flywheel tank 11. If the pulses from threshold detector 12 lead the pulses from pulse detector 10 output, frequency control 13 changes its output to cause the resonant frequency of tank 11 to slowly decrease.

If pulse detector 10 does not receive a pulse in a given cycle, flywheel tank 11 does not receive the input pulse and oscillations therein will begin to die out. If no pulses occur for a relatively large number of cycles, the oscillations will decay to below the pre-selected level and the output from threshold detector 12 will cease. Upon reappearance of the degraded input signal, some time may be required while the output pulls into synchronization with the input.

Figure 2:
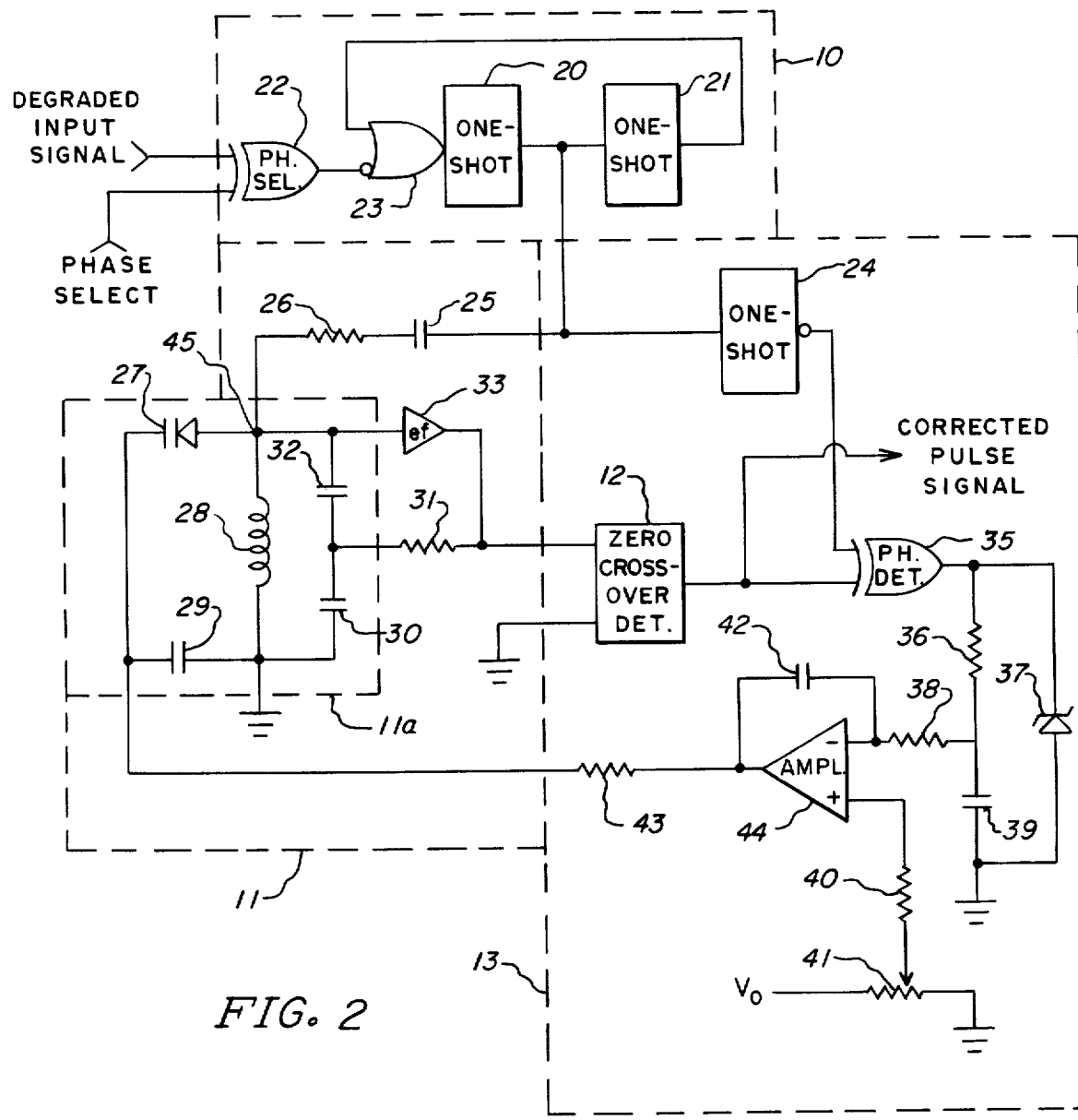
FIG. 2 is an electrical schematic of a preferred embodiment of the invention.
Figure 3:
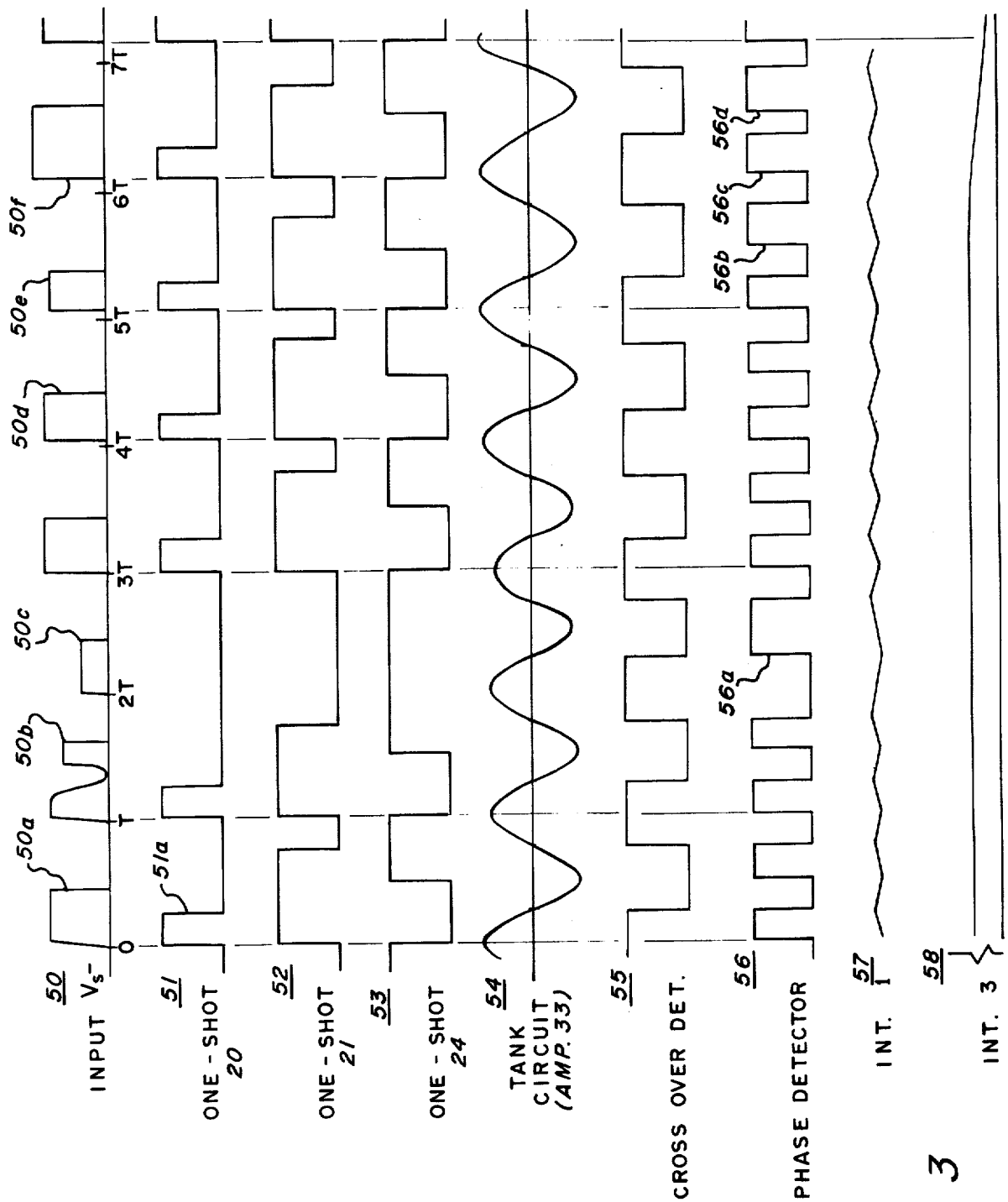
FIG. 3 depicts the time relationship of wave forms of signals produced by the various elements of the circuit of FIG. 2.

To explain the circuit of the FIG. 2, it is necessary to first establish conventions for the logic signals involved. Assume that a logical 0 is represented by 0 volts and a logical 1 is represented by a convenient positive voltage. This convention is adopted in FIG. 3, helpful in discussing this circuit. FIG. 3 shows waveforms of the outputs of the various circuit elements of FIG. 2 on a common time scale. One-shots 20, 21, etc. are set by a change on input from 0 to 1.

Phase select exclusive OR (ex-OR) gate 22 receives the degraded input signal and a phase select signal on its two inputs. Gate 22 issues a logical 1 output while receiving a logical 1 on one or the other but not both of its inputs. The purpose of gate 22 is to permit use of either the leading or trailing edges of the pulses in degraded input signal 50 (FIG. 3) as the time marks. With a 1 on the phase select input of gate 22, the output of gate 22 is the inversion of the signal 50, i.e. when signal 50 is 0 the output is 1, and vice versa. If a logical 0 is placed on the phase select input, the output of gate 22 is identical to degraded input signal 50. For many types of circuits forming gate 22 a 0 is created by grounding the phase select input and a 1 is created by allowing it to "float." For the remainder of this discussion, it is assumed that one-shot 20 sets on the leading edge of each pulse in waveform 50. Thus, in a typical circuit the phase select input to gate 22 will be 0 so that a change from 0 to 1 in the input signal causes output from gate 22 to change from 1 to 0. This is inverted by OR gate 23 causing one-shot 20 to set. One-shot 20 can have any convenient set time less than the nominal cycle time T of waveform 50. Normally this set time will be between 0.01T and 0.5T, with the 0.2T shown in FIG. 3 being a value preferred for many applications.

The output of one-shot 20 is applied to the input of one-shot 21. The output of one-shot 21 is applied to the non-inverting input of OR gate 23. The set time for one-shot 21 should be greater than that for one-shot 20, but less than the shortest possible cycle time. One-shot 21 sets before one-shot 20 clears and maintains a logical 1 on the input of one-shot 20 preventing one-shot 20 from setting again until one-shot 21 has cleared. This prevents spurious input pulses such as a pulse 50a in waveform 50 from causing one-shot 20 to set twice within one cycle. The output of one-shot 21 shown in waveform 52 has a set time of approximately 0.8T, a satisfactory value for most applications.

The output of one-shot 20 is also applied to the input of one-shot 24, and to capacitor 25. Capacitor 25 and the circuit elements associated with it and contained within box 11 correspond to flywheel tank circuit 11 of FIG. 1. The output of one-shot 20 passes through capacitor 25 and resistor 26 and is applied to tank circuit 11a comprising inductance 28, series-connected capacitors 30 and 32 in parallel with inductance 28, and capacitor 29 series-connected with varactor 27, similarly paralleled with inductor 28. Amplifier 33 receives the signal across capacitor 32, and feeds back a current signal following it through resistor 31 into the junction between capacitors 30 and 32, forming a conventional Colpitts oscillator configuration. However, resistor 31 is chosen to pass only enough current to permit oscillations in tank circuit to slowly decay in the absence of in-phase pulses from one-shot 20. As long as in-phase or nearly in-phase pulses are applied to tank circuit 11a from one-shot 20, tank circuit 11a will continue to oscillate. In essence, amplifier 33 and resistor 31 act to improve the Q of tank circuit 11a. The capacitance of varactor 27 is controlled by the voltage across it, increasing and decreasing as its cathode voltage decreases and increases respectively. Thus, the resonant frequency of tank circuit 11a increases and decreases inversely with varactor 27 cathode voltage.

The output of amplifier 33 also forms the output of tank circuit 11a, and is supplied to zero crossover detector 12. Zero crossover detector 12 can simply comprise a high-gain differential amplifier having its "−" terminal grounded. As amplifier 33 output swings above and below 0 volts the output of crossover detector 12 correspondingly swings above and below 0 volts also. The high gain of such an amplifier causes output rise and fall times between logic levels to be much shorter than the input times. Zener diode clamps (not explicitly shown) on the output create the desired 0 to 1 logic levels. The output of zero crossover detector 12 is the desired corrected pulse signal, differing only in that it is shifted by a constant phase angle with respect to the input signal and is symmetrical.

Tank frequency control 13 operates by comparing the degraded input signal phase relationship with the corrected pulse signal, and changing the voltage applied to varactor 27 so as to maintain the constant phase difference. One-shot 24 receives the output of one-shot 20 and itself sets each time one-shot 20 sets. The set time of one-shot 24 should be chosen to be near the nominal half cycle time of the degraded input signal. Ex-OR circuit 35 functions as a phase detector between the output of one-shot 24 and the corrected pulse signal from crossover detector 12. The output of phase detector 35 is integrated three times. The first integration is performed by the series circuit of resistor 36 and capacitor 39 connected between the output of phase detector 35 and ground. Zener diode 37 limits the maximum voltage from phase detector 35. The integral of phase detector 35 output is represented by the voltage on capacitor 39, waveform 57, which is applied through resistor 38 to the "−" terminal of amplifier 44. Capacitor 42 is connected between the "−" input and the output of amplifier 44, and as thus connected with resistor 38 forms a second integrator. The "+" terminal of amplifier 44 is connected by resistor 40 to the variable resistance terminal of potentiometer 41. Potentiometer 41 is connected between voltage source Vo and ground, and provides an adjustable voltage for the "+" terminal of amplifier 44. Adjustment of potentiometer 41 allows balancing to output of phase detector 35 at the nominal frequency, the condition which reduces output frequency drift during a sequence of missed input pulses. Potentiometer 41 must be adjusted to cause inversion of the output signal by amplifier 44 in this embodiment. The output of this second integrator is applied to resistor 43 and capacitor 29 in series therewith to ground. Resistor 43 and capacitor 29 form the third integrator whose output, the voltage across capacitor 29, waveform 58, is applied to the cathode of varactor 27.

The operation of the circuit can be conveniently explained by using the degraded input signal shown as waveform 50 as a model input. It must be understood that it is typical only as to the defects inserted in it to aid understanding the circuit's operation. Assume the phase select input of phase select gate 22 is open to invert the output and cause one-shot 20 to set on the positive-going edges of waveform 50. Thus, pulse 50a causes one-shot 20 to set and produce pulse 51a. Pulse 51a duration is assumed to be 0.2T. Each pulse emitted by one-shot 20 causes one-shot 21 to set. The set time of one-shot 21 in FIG. 2 is 0.8T. When one-shot 21 sets (which must be before one-shot 20 clears) then the output of OR gate 23 remains a logical 1 until one-shot 21 clears. This prevents a spurious pulse in waveform 50, such as pulse 50b, from causing one-shot 20 to set twice within one input cycle. One-shot 21 must clear, however, before another scheduled pulse from waveform 50 occurs, to allow normal processing of it, hence its maximum set time is less than T.

Each pulse from one-shot 20 has its DC component removed by capacitor 25 and its peak attenuated by resistor 26 before being applied to tank circuit 11a. As previously explained, these pulses, while in phase, will maintain oscillation at the resonant frequency dictated by voltage across capacitor 29. The output of emitter follower amplifier 33, waveform 54, is squared up and phase shifted by a constant amount by zero crossover detector 12, forming the corrected pulse signal waveform 55 which is the desired output. While tank circuit 11a is shown in a Colpitts oscillator configuration, a Hartley or Armstrong oscillator design can be used as well.

Tank frequency control 13 controls the resonant frequency of tank circuit 11 by comparing the phase relationship between the input signal waveform 50 and the corrected signal waveform 55. If input signal waveform 50 slows down, as exaggeratedly shown by pulses 50d–f, then phase detector 35 output, waveform 56, will be a logical 1 less than 50% of the time as shown by pulses 56b–d. Upon triple integration and inversion of waveform 56, the relatively long duration of pulses 56b–d causes the voltage across capacitor 29, shown as waveform 58, to decrease, increasing the capacitance of varactor 27. This in turn lowers resonant frequency of tank circuit 11a. Similarly, if input signal 50 has a logical 1 level more than half the time, voltage of capacitor 29 increases. As this voltage increases, the capacitance of varactor 27 decreases causing the resonant frequency of tank circuit 11a to increase and pull the output into the desired phase relationship with the input signal. It should be kept in mind that because of three stages of integration of the error signal, response is slow to changes in frequency of the input signal. A rapid change in input signal frequency will be totally ignored. However, a very frequent type of frequency change in an input signal is a slow drift occasioned by temperature changes in an electronic oscillator, or speed changes in rotating mechanical equipment such as a memory disk spindle. Such changes are followed very closely and accurately by this circuit.

Another type of short term frequency change, usually not thought of as a frequency change, is caused by a dropped or attenuated pulse, such as pulse 50c in FIG. 3. Because of the high-Q design of flywheel tank circuit 11, one or even several successive missing pulses are automatically inserted in output signal 55. Only after a number of omitted pulses do oscillations in tank circuit 11a and output pulses, cease. While input pulses are absent, the output of crossover detector 12 becomes the error signal since during this interval the output of one-shot 24 is continuously logical 0. This condition is displayed by pulse 56a in the phase detector waveform 56. Since the output of tank circuit 11a is approximately a sine wave, as shown by waveform 54, and therefore symmetric this means that the "no input signal" frequency to which the output signal will slowly drift is that resulting from the corresponding phase detector 35 output having equal logical 1 and logical 0 times. What the "no input signal" frequency will be is dependent on the steady state voltage across capacitor 29 responsive to such a 50/50 output from phase detector 35 and on the values of the tank circuit components and the resonant frequency produced by that voltage across capacitor 29. If few pulses are likely to be missing from the input signal then special component value selection for a desired "no input signal" frequency is unnecessary. But if this frequency will be reached before oscillations in tank circuit 11a cease and if substantial numbers of missing pulses are expected in the input signal, then tank circuit 11 should be designed to a suitable "no input signal" frequency. Such component selection is well within the capabilities of those having ordinary skill in the art.

The ability of this circuit to replace in the output signal "missing" pulses in the input signal makes it an effective frequency multiplier. To accomplish this certain changes in previously described parameters are necessary. The nominal frequency of the tank circuit with 50% logical 1 pulses produced by phase detector 35 should be elected to be close to the desired output frequency. Set time of one-shot 20 must be chosen to be a fraction of the cycle time of the desired output frequency. The set time of one-shot 21 need not be changed from that previously described for phase locked output, but it can be increased to be only slightly smaller than the cycle time of the input signal. The first few input signal pulses cause one-shot 20 to produce pulses applied to flywheel tank circuit 11 which begins to resonate at the nominal frequency. The Q of flywheel tank circuit 11 must create an oscillation damping time long enough to sustain oscillations between input signal pulses. This can be easily accomplished by proper selection of resistor 31 and amplifier 33. Since phase shifts are detected only when an input signal pulse occurs, input signal frequency change must occur more slowly during frequency multiplication.

This circuit can also be used as a frequency divider by selecting the set time of one-shot 21 to be just slightly shorter than the desired output signal cycle time. While one-shot 21 is set, input pulses received by the circuit cannot set one-shot 20 and cause pulses to be applied to tank circuit 11a. When used as a frequency divider, the circuit tracks input signal frequency change very accurately since every output signal pulse is phase compared with a corresponding input signal, producing frequency control signals which change tank circuit 11a resonant frequency as needed to maintain the selected phase angle between the input and output signals.

In any of these modes of operation, it is possible that the circuit will lock on the wrong frequency under certain conditions if tank circuit 11a has too great a bandwidth as varactor 27 capacitance varies from its least to its greatest value. After power is applied to the circuit of FIG. 2 and before an input signal is applied to it, one-shot 24 applies a constant logical 0 to one input of phase detector 35. The output of zero crossover detector 12, applied to the other input of phase detector 35 is also 0. Therefore voltage across capacitor 39 will be the very lowest possible and voltage across capacitor 29 will be the highest possible, causing the resonant frequency of tank circuit 11a to be the highest possible. Thus, if the bandwidth of flywheel tank circuit 11 spanned an entire octave with the input signal frequency being the lowest in the band, it is possible that the circuit would double the frequency by producing an output signal having twice the input signal frequency. There is no simple way to prevent this occurrence if it is not desired other than by designing the bandwidth of flywheel tank circuit 11 to include no higher harmonics of the input signal. Similarly, an embodiment of this circuit should have a "no input signal" resonant frequency greater than the first subharmonic of the highest input frequency possible to avoid halving the input signal. When frequency multiplication or division is desired, the bandwidth of tank circuit 11a and its "no input signal" resonant frequency must be chosen such that the first frequency reached as signals are applied to junction 45 is the desired output frequency. In these cases bandwidth of tank circuit 11a must be chosen to encompass the desired output frequency and exclude any other frequency on which the circuit might lock during startup. For frequency division only, proper selection of set time for one-shot 21 can be selected to block all but the desired input signal pulses from one-shot 20.

Figure 4:
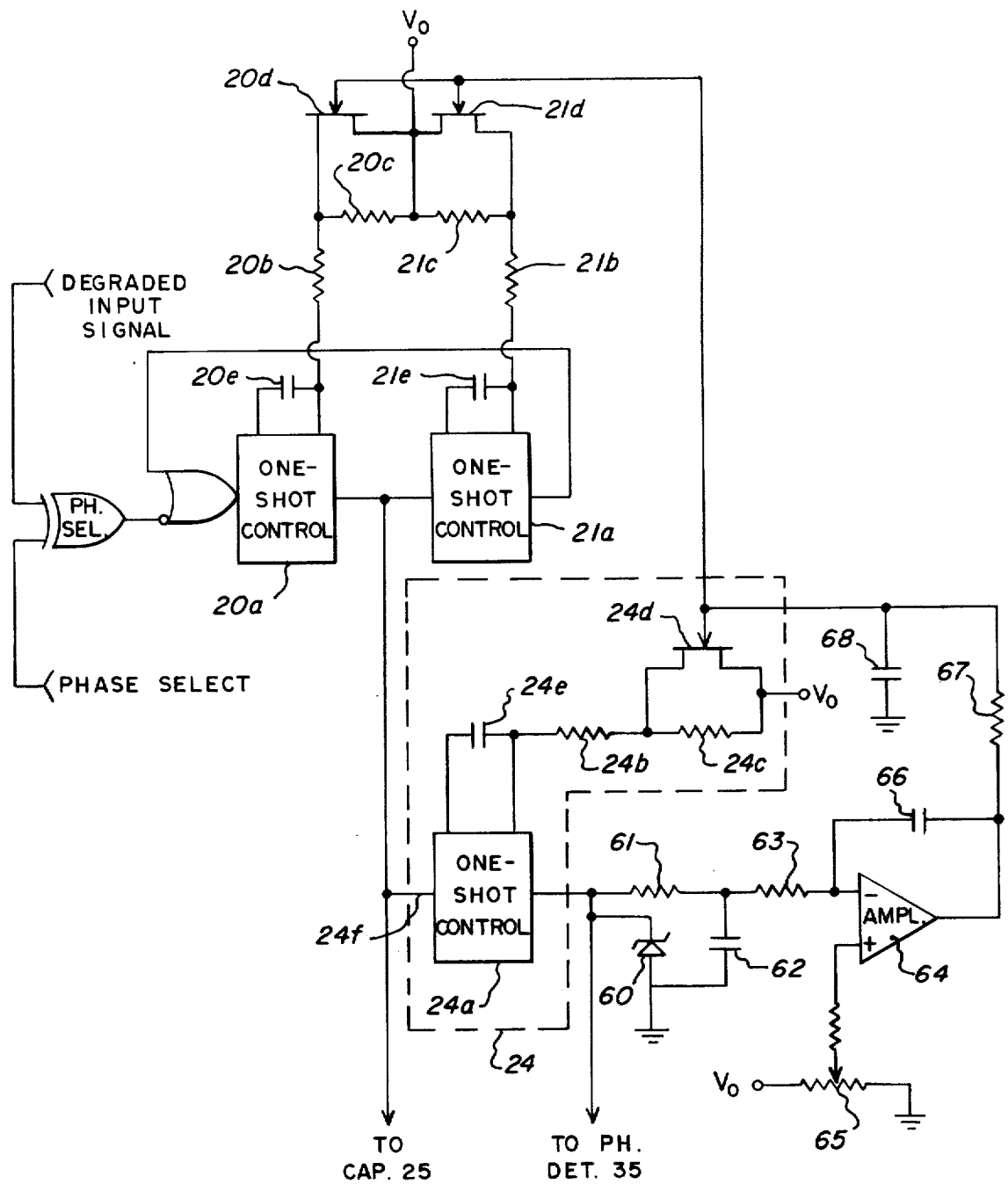
FIG. 4 is a circuit schematic of a second embodiment of a portion of the circuit of FIG. 2, which allows the circuit to track with greater accuracy a wider range of frequencies.

When the degraded input signal is of the type which has fairly wide frequency deviations along with cases of several consecutive missing pulses, the return of phase detector 35 to a balanced output signal during the missing pulses means that the output signal frequency may well drift unacceptably far from the frequency of the input signal pulses preceding those missing. Accordingly, the circuit of FIG. 4 is designed to constantly adjust the set time of one-shot 24 so that the output of phase detector 35 will be a balanced square wave having equal logical 1 and logical 0 times. FIG. 4 discloses one-shot 24 in greater detail, as comprising one-shot control 24a and circuit elements 24b–e associated therewith. One-shot control 24a changes its output from 0 to 1 when a change from 0 to 1 occurs on its input terminal 24f. At the same time, a low impedance path maintained across capacitor 24e is opened, allowing capacitor 24e to be charged by voltage through resistors 24b and 24c and transistor 24d. When capacitor 24e voltage reaches a pre-set level, one-shot control 24a output returns to 0 and the low impedance path across capacitor 24e is reestablished. Another change from 0 to 1 at input 24f causes these operations to repeat.

A triple integration is performed on the output of one-shot control 24a. The first integration is performed by resistor 61, in series with capacitor 62 to ground. The voltage across capacitor 62 comprises the desired first integral value. Zener diode 60 paralleled with capacitor 62 limits output voltage from one-shot control 24a. The voltage across capacitor 62 is applied to the "−" input terminal of amplifier 64 through resistor 63. Integrating capacitor 66 is connected between the "−" terminal and the output of amplifier 64. As explained previously, this is the conventional configuration of an amplifying and inverting integrator. An adjustable voltage is applied to the "+" terminal of amplifier 64 by potentiometer 65. Voltage Vo supplies the voltage drop across the resistive element of potentiometer 65 and adjustment of the slider provides the desired adjustable voltage. By increasing and decreasing the voltage on the "+" terminal appropriately, the output of amplifier 64 can be made larger or smaller for a given input signal. The output of amplifier 64 is again integrated by the series circuit of resistor 67 (receiving the output of amplifier 64) and capacitor 68 connected to ground. The final integral value, represented by the voltage across capacitor 68, is applied to the gate of field effect transistor 24d. Changing the voltage on the gate of field effect transistor 24d changes the voltage across its output terminals, causing capacitor 24e to charge at a different rate of speed. Set time of one-shot 24 decreases with more rapid change of voltage across capacitor 24e, so the characteristics of transistor 24d must be such that impedance across its output terminals decreases as the time between successive input pulses to one-shot control 24a decreases. Since field effect transistors are available with several different response characteristics, no problem in selecting an appropriate one will occur.

During operation, frequency of the input signal can increase or decrease. For example, if it increases then to cause the set time of one-shot 24 to occupy more than 50% of the interval between successive pulses, the set time must be decreased. The initial increase in set time causes capacitor 62 to charge to a slightly higher voltage which in turn, causes a decrease in voltage across capacitors 66 and 68. The decreased capacitor 68 voltage decreases impedance across the output terminals of transistor 24d causing capacitor 24e to charge at a slightly greater rate, decreasing the set time of one-shot 24, the desired effect. When a series of input pulses are missing, the set time of one-shot 24 begins to slowly increase. The change is very slow because of the three levels of integration through which the change must pass before set time is affected. Only after set time of one-shot 24 begins to drift is the output of phase detector 35 altered, causing eventual change in the resonant frequency of tank circuit 11a. In contrast, changes in frequency of the input signal affect phase detector 35 output immediately by shifting the leading edge of the logical one pulse from one-shot 24.

Adjustment of potentiometer 65 is quite simple. Keeping in mind that a balanced output from phase detector 35 is the desired situation, potentiometer 41 is adjusted while the nominal frequency is applied to the input signal terminal, until phase detector 35 output is balanced. Then potentiometer 65 is adjusted and the balance in one-shot 24 output observed as the input signal is swept through the design frequency range. When approximate balance throughout this entire range is achieved, then a balanced output from phase detector 35 will occur.

The circuitry associated with one-shot controls 20a and 21a have the same characteristics as displayed for one-shot control 24a. The set times both increase and decrease in the exact percentage that the set time of one-shot 24 increases and decreases and thus flywheel tank circuit 11 input from one-shot 20 and the noise immunity lent one-shot 21 are made relatively independent of input signal frequency.

The foregoing has described the invention.

What is claimed is:

1. Apparatus receiving a degraded synchronous pulse signal and supplying a corrected data pulse signal in which missing pulses have been replaced and phase shifted pulses have been properly positioned, comprising:

a. a flywheel tank circuit whose resonant frequency varies responsive to a frequency control signal, which produces an oscillating output signal whose amplitude remains above a pre-selected value responsive to an in-phase substantially synchronous pulse train at a pulse train input and which decays to less than the predetermined value within a predetermined number of cycles upon cessation of the in-phase synchronous pulse train;

b. a pulse detector receiving the degraded pulse signal and supplying a pulse to the pulse train input of the flywheel tank circuit at a selected time following each crossing of a pre-selected level in a pre-selected direction by the degraded data pulse signal;

c. a threshold detector receiving the output of the flywheel tank circuit and producing the corrected data pulse signal having first and second values respectively as the flywheel tank circuit output signal is greater and less than a pre-selected value;

d. a first one-shot receiving the pulse detector output, and having an on time substantially less than the shortest time between the start of adjacent pulses of the degraded data pulse signal;

e. an exclusive OR circuit receiving as inputs the output of the first one-shot and the threshold detector; and f. a first integrator circuit receiving the exclusive OR circuit output and a second integrator circuit receiving the output of the first, and supplying its output to the flywheel tank circuit as the frequency control signal.

2. The apparatus of claim 1, wherein the first one-shot has a set time substantially equal to one-half the mean time between the start of adjacent pulses of the degraded pulse signal.

3. The apparatus of claim 2, wherein the first one-shot further includes means for varying its set time responsive to a set time control signal, and wherein said apparatus further comprises adjustable integrator means receiving the output of the first one-shot and for integrating said first one-shot output, for supplying the set time control signal to the first one-shot, and for varying the set time control signal to maintain the set time of the first one-shot substantially equal to the mean time between the start of a selected number of adjacent pulses of the degraded pulse signal preceding.

4. The apparatus of claim 3, wherein the adjustable integrator means further comprises an integrating amplifier and an adjustable voltage source applying voltage to one integrating amplifier input terminal.

5. The apparatus of claim 1, wherein the pulse detector comprises a second one-shot having set time substantially less than the time between the start of adjacent pulses of the degraded pulse signal.

6. The apparatus of claim 5 wherein the second one-shot further comprises means for blocking input of the degraded pulse signal to itself for a preselected interval between each adjacent pair of degraded pulses.

7. The apparatus of claim 1, wherein the flywheel tank circuit comprises:

a. an impedance receiving the pulse detector output at its first terminal;

b. a tank circuit the voltage across which forms the flywheel tank circuit output signal, and comprising:

i. an inductor connected to the second terminal of the impedance, and ii. A capacitor in parallel with the inductor and connected to the output of the frequency control means, and whose value increases and decreases respectively as the corrected data pulse signal, leads and lags the pulse detector output; and c. A Q enhancement circuit receiving the tank circuit voltage and supplying current to the tank circuit in phase with tank circuit current.

8. The apparatus of claim 7, wherein the capacitor includes a varactor connected at one terminal to the second terminal of the impedance and receiving the frequency control means output at its other terminal.

* * * * *